United States Patent
Gaboriau et al.

(10) Patent No.: US 7,308,027 B1
(45) Date of Patent: Dec. 11, 2007

(54) CIRCUITS AND METHODS FOR REDUCING DISTORTION AND NOISE IN PULSE WIDTH MODULATION SYSTEMS UTILIZING FULL-BRIDGE DRIVERS

(75) Inventors: Johann Guy Gaboriau, Austin, TX (US); Melvin L. Hagge, Round Rock, TX (US); Lingli Zhang, Austin, TX (US); John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 486 days.

(21) Appl. No.: 10/828,816

(22) Filed: Apr. 21, 2004

(51) Int. Cl.
*H03K 7/08* (2006.01)

(52) U.S. Cl. ..................................... 375/238

(58) Field of Classification Search ................ 375/238, 375/316, 295, 257, 258; 329/312, 311; 332/109, 332/106; 327/31, 38; 370/205
See application file for complete search history.

(56) References Cited

U.S. PATENT DOCUMENTS

| | | | |
|---|---|---|---|
| 5,631,817 A * | 5/1997 | Minami | 363/98 |
| 6,373,336 B1 | 4/2002 | Anderskouv et al. | |
| 6,501,234 B2 * | 12/2002 | Lin et al. | 315/307 |
| 6,614,208 B2 * | 9/2003 | Narita | 323/283 |
| 2003/0042976 A1 * | 3/2003 | Midya et al. | 330/10 |
| 2003/0071586 A1 * | 4/2003 | Lin et al. | 315/291 |
| 2007/0116109 A1 * | 5/2007 | Stanley | 375/238 |

* cited by examiner

*Primary Examiner*—Tesfaldet Bocure
(74) *Attorney, Agent, or Firm*—James J. Murphy; Thompson & Knight LLP

(57) ABSTRACT

A pulse width modulation circuit for driving a full-bridge output load includes a pulse width modulation stage for generating, from an input data stream, a pulse width modulated data stream for driving a terminal of a full-bridge output load and another pulse width modulated data stream for driving another terminal of the full bridge output load. A delay circuit delays the another pulse width modulated data stream relative to the pulse width modulated data stream such that edges of the another pulse width modulated data stream and edges of the pulse width modulated data stream are temporally spaced.

25 Claims, 5 Drawing Sheets

CIRCUITS AND METHODS FOR REDUCING DISTORTION AND NOISE IN PULSE WIDTH MODULATION SYSTEMS UTILIZING FULL-BRIDGE DRIVERS

FIELD OF INVENTION

The present invention relates in general to pulse width modulation techniques, and in particular, to circuits and methods for reducing distortion and noise in pulse width modulation systems utilizing full-bridge drivers.

BACKGROUND OF INVENTION

Delta-sigma modulators (noise shapers) are particularly useful in digital to analog and analog to digital converters (DACs and ADCs). Using oversampling, a delta-sigma modulator spreads quantization noise power across the oversampling frequency band, which is typically much greater than the input signal bandwidth. Additionally, a delta sigma modulator performs noise shaping by acting as a lowpass filter to the input signal and a highpass filter to the noise; most of the quantization noise power is thereby shifted out of the signal band.

In addition to data conversion applications, delta-sigma noise shapers are increasingly utilized in the design of digital amplifiers. In one particular technique, a digital delta-sigma noise shaper provides a noise shaped (quantized) digital data stream to a pulse width (duty cycle) modulated (PWM) stream, which in turn drives a linear amplifier output stage and associated load. This technique is generally described in U.S. Pat. No. 5,784,017, entitled "*Analogue and Digital Convertors Using Pulse Edge Modulators with Non-linearity Error Correction*", granted Jul. 21, 1998, and U.S. Pat. No. 5,548,286, entitled "*Analogue and Digital Convertor Using Pulse Edge Modulators with Non-linearity Error Correction*", granted Aug. 20, 1996, both to Craven, U.S. Pat. No. 5,815,102, entitled "*Delta Sigma PWM DAC to Reduce Switching*", granted Sep. 29, 1998, to the present inventor (incorporated herein by reference), U.S. patent application Ser. No. 09/163,235 to Melanson (incorporated herein by reference), and International Patent Application No. PCT/DK97/00133 by Risbo.

One problem, which occurs in PWM circuits driving full-bridge loads, is noise and distortion caused by the non-zero impedance of the voltage supply. In particular, for a full-bridge output, a pair of drivers, typically operating from a single voltage supply, is utilized to drive a corresponding pair of output signal paths coupled to the full-bridge output load. Glitches on the output signal paths occur when the outputs of the two drivers switch simultaneously or nearly simultaneously. Specifically, the output of one-driver transitions towards the power supply voltage and the output of the other driver transitions towards ground. Due to the non-zero impedance of the voltage supply, the output paths do not settle to their final state instantaneously, and glitches are generated as an intermediate voltage appears across the corresponding outputs.

One approach to driving in a full-bridge output of a PWM system is disclosed in U.S. Pat. No. 6,373,336 to Anderskouv et al., and entitled *Method Of Attenuating Zero Crossing Distortion And Noise In An Amplifier, An Amplifier And Uses Of The Method And The Amplifier*, issued Apr. 16, 2002 (hereinafter the Anderskouv system). In this system, each terminal of a full-bridge output load is driven by a different PWM encoded signal provided by a corresponding separate PWM processing path. One processing path processes an input data stream, while the other processing path processes the complement of the input data stream. These complementary data streams drive a corresponding pair of delta-sigma modulators. Except for small levels of the input signal, when the input stream and its complement are close in value, the delta-sigma modulators generate substantially different modulated streams. The modulated data streams drive corresponding separate PWM modulation stages, which in turn drive the terminals of the full-bridge output loads.

Disadvantageously, the Anderskouv system does not guarantee that the outputs of the PWM modulators will not switch simultaneously or nearly simultaneously. In particular, for small values of the input signal, the outputs of the PWM stages of the Anderskouv system will switch nearly simultaneously. This near simultaneous switching will cause power supply glitches in the output signal, which will not be masked by the corresponding small output signals. Another significant disadvantage of the Anderskouv system is its hardware inefficiency, since two PWM paths, each including a PWM encoder, are required. This hardware inefficiency is particularly disadvantageous when utilized in multi-channel signal processing systems, such as those required in advanced audio applications, such as home theater audio.

Hence, given the increased utilization of PWM systems in such applications as audio signal processing, new, efficient, techniques are required for minimizing distortion and noise in full-bridge outputs driven by PWM—encoded data.

SUMMARY OF INVENTION

The principles of the present invention are embodied in pulse width modulation circuits and methods, which allow a single pulse width modulator stage to drive a full-bridge output load with minimal distortion and noise. According to one exemplary embodiment, a pulse width modulation circuit is disclosed for driving a full-bridge output load, which includes a pulse width modulation stage for generating, from a input stream, a pulse width modulated data stream for driving a terminal of a full-bridge output load and another pulse width modulated data stream for driving another terminal of the full bridge output load. A delay circuit delays the another pulse width modulated data stream relative to the pulse width modulated data stream such that edges of the another pulse width modulated data stream and edges of the pulse width modulated data stream are temporally spaced.

Embodiments of the present principles are efficient, since only a single pulse width modulator stage or circuit is required to drive a full-bridge load with the required pair of pulse width modulated data streams. The inclusion of a delay in a selected one of the data streams insures that corresponding edges of such pulse width modulated data streams do not coincide at the circuit output. Advantageously, noise and distortion are minimized, even if a single power supply is utilized by the driver circuits driving the full-bridge load. The efficiencies realized by these principles are particularly useful in multiple-channel pulse width modulation devices, such as those utilized in multiple-channel audio systems.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-5 of the drawings, in which like numbers designate like parts.

Figure 1:
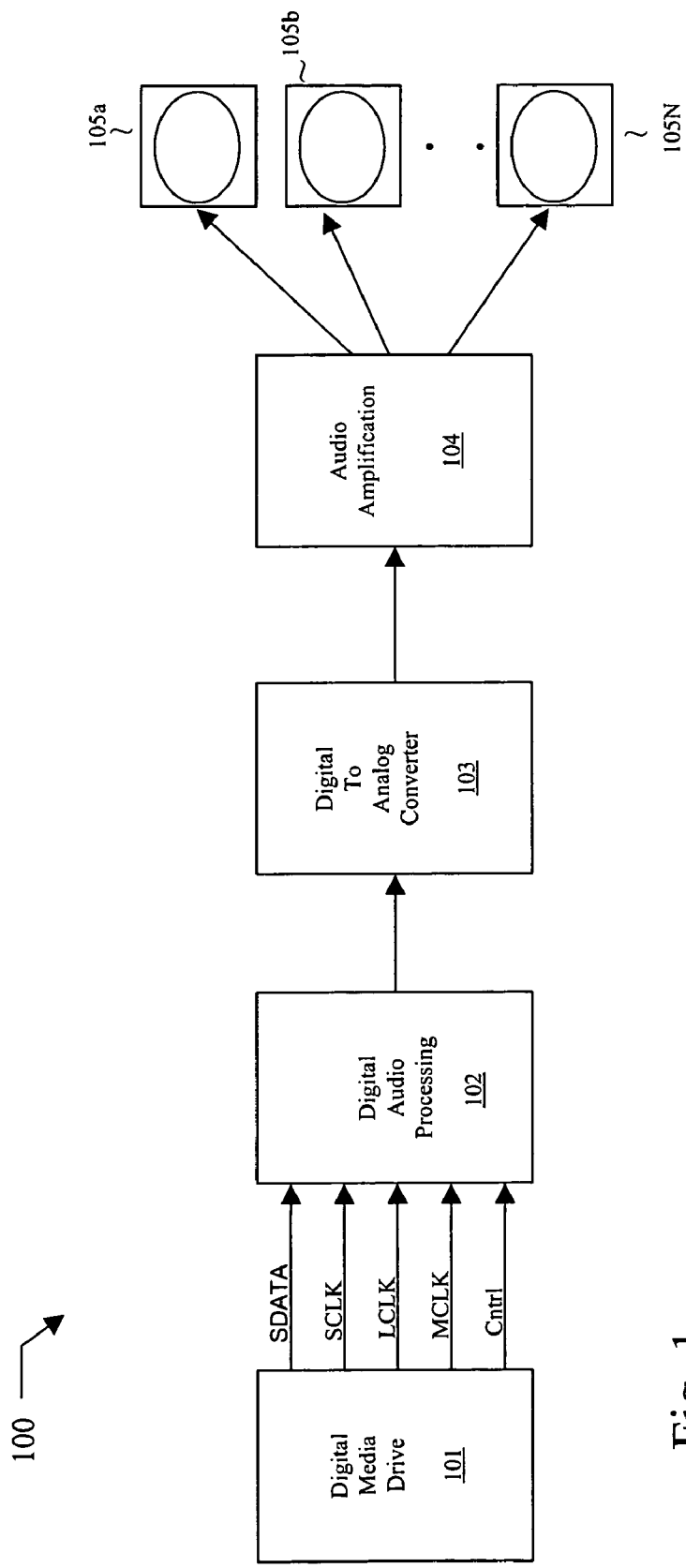
FIG. 1 is a block diagram of an exemplary audio system suitable for describing the principles of the present invention.

FIG. 1 is a diagram of an exemplary digital audio system 100 according to the principles of the present invention. Advantageously, system 100 processes digital audio input data in the digital domain prior to conversion to analog form, as discussed in detail below.

Serial audio data (SDATA) are recovered from the given digital audio storage media by a digital media drive 101, such as a compact disk (CD) player, digital audio tape (DAT) player, or digital versatile disk (DVD) unit. In the illustrated embodiment, the recovered audio data are in a multiple-bit format such as PCM. In addition to the audio data stream SDATA, media drive 101 also provides the corresponding audio clock and control signals. In particular, the audio data are input in response to the serial clock (SCLK) signal, which times the input of each data bit of the audio data stream SDATA, a left—right clock (LRCK) signal, which times the input of samples of left and right channel stereo data, and a master clock (MCLK), which controls the overall audio processing timing.

The resulting recovered audio data stream SDATA undergoes digital processing, including digital filtering, in digital audio processing block 102, prior to conversion to analog audio in digital to analog converter (DAC) 103. Amplifier block 104 then drives a set of speakers 105a, 105N. For example, in a home theater application, speakers 105a, 105N may be utilized in any combination for the front—left, front—right, surround—left, surround—right, center, subwoofer, rear—left, and rear—right channels. As discussed further below, in the illustrated embodiment, speakers 105a, . . . , 105N are driven in a full-bridge fashion.

Figure 2:
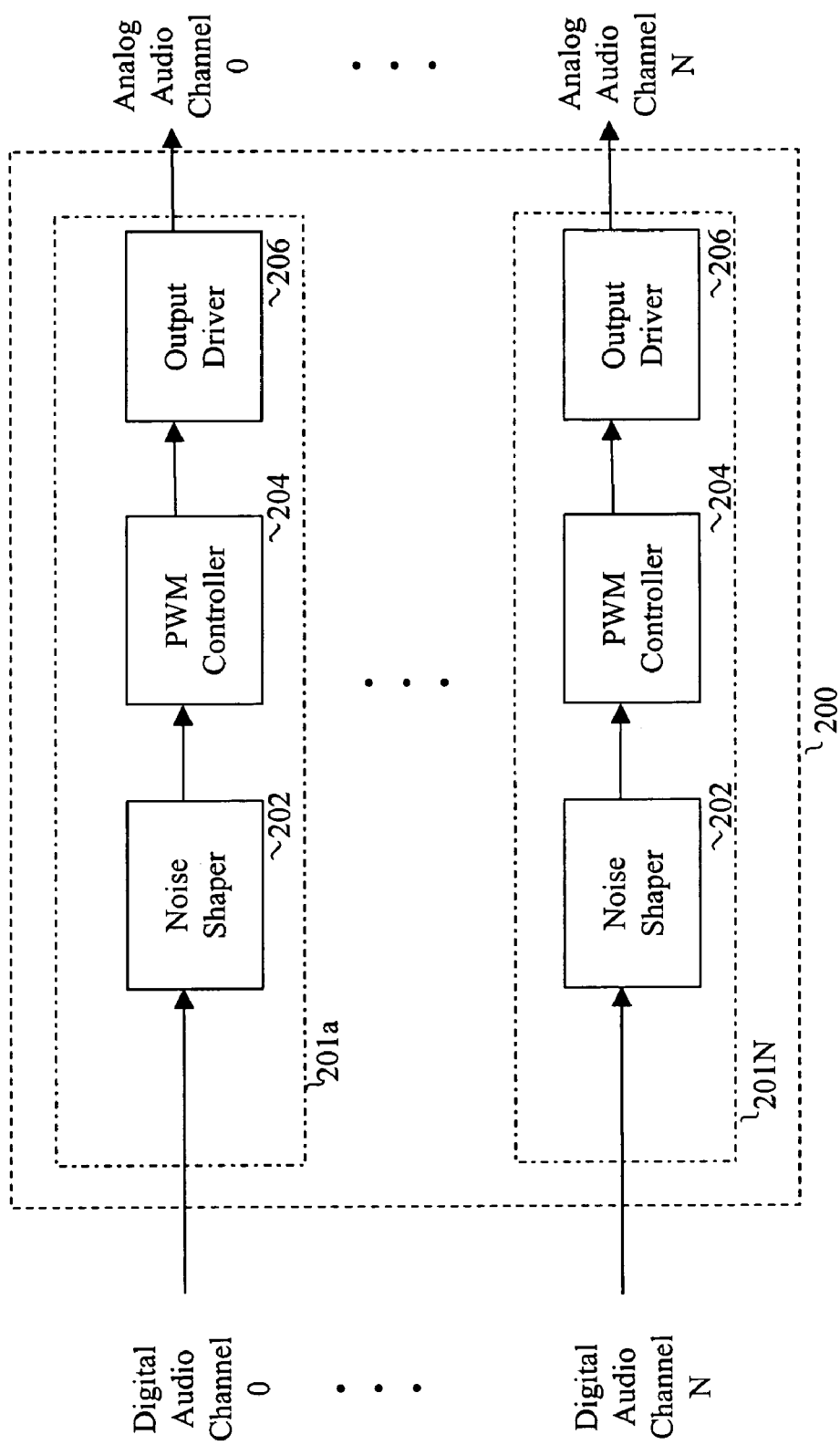
FIG. 2 is a representative multiple-channel digital to analog converter (DAC) suitable for use in the digital to analog converter shown in the system of FIG. 1.

FIG. 2 is block diagram of an exemplary multiple-channel audio DAC 200 embodying the principles of the present invention. In one particular representative application, multiple-channel DAC 200 is suitable for utilization in DAC 103 of system 100 shown in FIG. 1. While the principles of the present invention are illustrated in a multiple channel audio DAC as an example, these principles are applicable to a wide range of multiple-channel and single-channel circuits and systems utilizing PWM techniques.

Multiple-channel audio DAC 200 is discussed in further detail below. However, generally, DAC 200 includes N number of processing paths 201a, . . . , N, two of which, 201a and 201N, are shown for reference in FIG. 2. For stereo embodiments of system 100 of FIG. 1, two processing paths 201a, . . . , N are utilized (i.e. N=2) for driving left and right channel data to a pair of speakers 105a, . . . , 105b. Home theater applications of DAC 200 typically utilize five processing paths 201a, . . . , N (i.e. N=5), for processing right, left, center, left—surround, and right—surround channel data.

Each processing path 201a, . . . , N includes a noise shaper (delta-sigma modulator) 202 for re-quantizing the corresponding channel of digital audio data $D_{igital}$ $A_{udio}$ $C_{hannel}$ 1—$D_{igital}$ $A_{udio}$ $C_{hannel}$ N and shifting the resulting quantization noise out of the audio band. The noise shaped and re-quantized digital data output from noise shaper 202 of each data path 201a, . . . , N are converted by a PWM stage 204 into a duty cycle modulated data stream which drives a full-bridge output driver 206. In turn, full-bridge output driver 206 drives the analog output for the corresponding analog audio channel $A_{nalog}$ $A_{udio}$ $C_{hannel}$ 1—$A_{nalog}$ $A_{udio}$ $C_{hannel}$ N.

Figure 3:
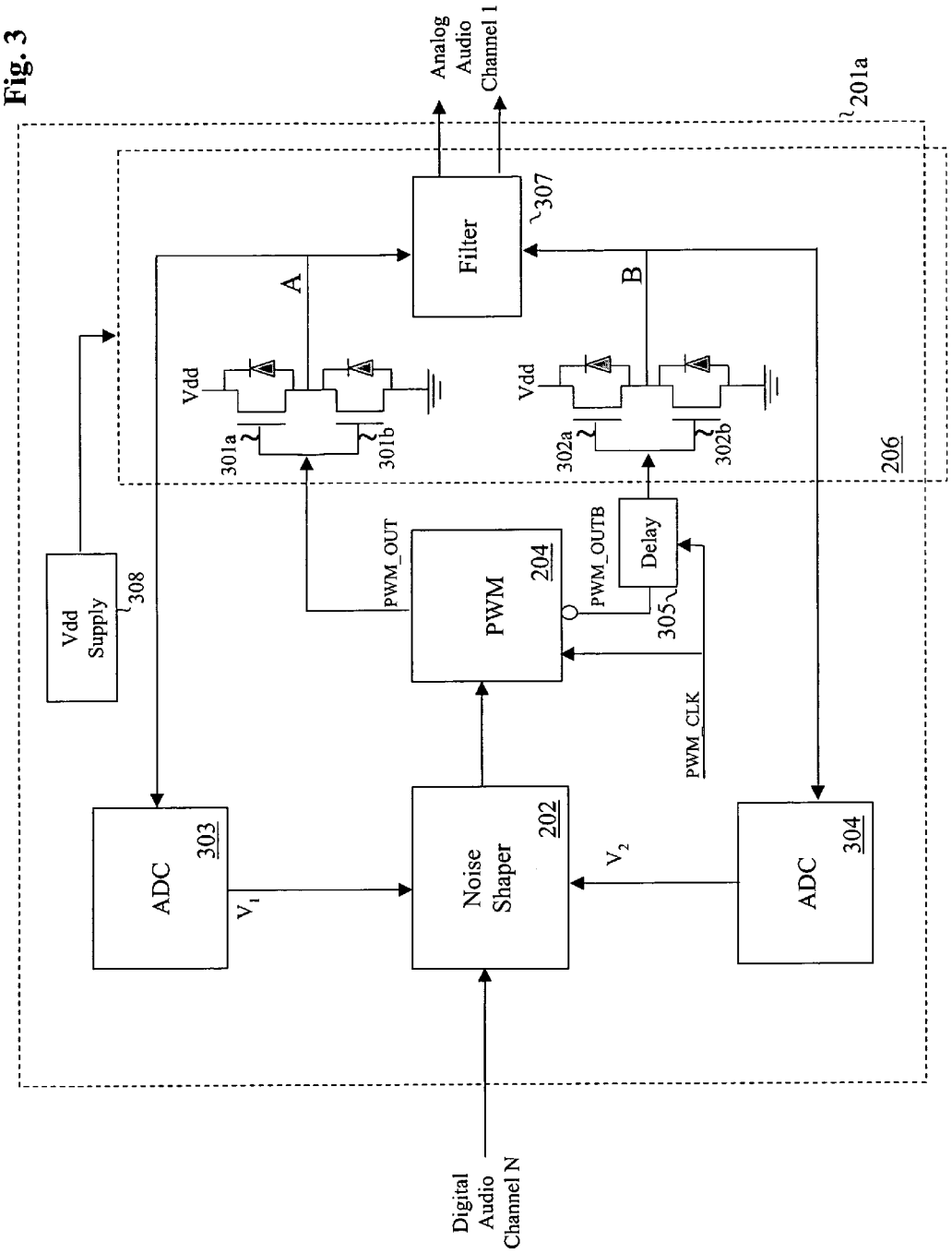
FIG. 3 is a more detailed block diagram of a selected one of the data paths shown in FIG. 2.

FIG. 3 is a more detailed functional block diagram of processing path 201a, which is representative of each of the processing paths 201a, . . . , 201N shown in FIG. 2. Processing path 201a includes noise shaper (delta-sigma modulator) 202, which shifts noise in the audio baseband of the input signal $D_{igital}$ $A_{udio}$ $C_{hannel}$ 1 to higher out-of-band frequencies using oversampling and quantization. Noise shaper 202 utilizes non-linear feedback from the corresponding output stage 206 to compensate for variable moments in the following pulse width (duty cycle) modulated signal from PWM stage 204. Examples of delta-sigma modulators utilizing such non-linear feedback are described in coassigned U.S. Pat. No. 6,150,969 to Melanson, entitled *Correction of Nonlinear Output Distortion In a Delta Sigma DAC*, and U.S. Pat. No. 5,815,102 to Melanson, entitled *Delta Sigma PWM DAC to Reduce Switching*, both of which are also incorporated herein by reference. A general discussion of noise shaper (delta-sigma modulator) topologies is found in publications such as Norsworthy et al., *Delta-Sigma Data Converters, Theory, Design and Simulation*, IEEE Press, 1996.

Exemplary pulse-width modulator (PWM) stage 204 shown in detail in FIG. 3 converts each quantized digital sample from noise shaper 202 into a pulse width (duty-cycle) modulated data pattern. Specifically, in pulse width (duty cycle) modulation, each digital input word is converted into a pattern of logic high and logic low levels over a given time period (i.e. the duty cycle of the output signal is directly proportional to the value of the digital input word). There are a number of known techniques for partitioning the output time period into logic high and low levels to generate the output pattern with the proper duty-cycle. For example, in thirty-two level pulse width modulation of thirty-two bit digital words, each digital word is represented by a pattern across a time period T of thirty-two slots or clock periods and representing one level. In one PWM encoding scheme, a maximum negative input value is represented as an output pattern of zero (0) logic high slots and thirty-two (32) logic low slots, corresponding to a zero-percent (0% or 0/32) duty cycle. An input of zero (0) is then represented by a pattern of sixteen (16) logic low slots and sixteen (16) logic high slots corresponding to a fifty-percent (50% or 16/32) duty cycle. A maximum positive input value in this scheme is represented by a pattern with a one-hundred percent (100% or 32/32) duty cycle corresponding to thirty (32) logic high slots and zero (0) logic low slots. The distribution of the logic high slots across the entire thirty-two bit period will vary, depending on the generation technique, so long as the duty cycle is of the appropriate percentage.

The PWM stream output from pulse width modulator stage 204 in turn controls a pair of full-bridge drivers, respectively formed by switch pairs 301a and 301b and 302a and 302b. Switch pairs 301a and 301b, and 302a and 302b are driven by the output PWM_OUT of PWM stage 204, and its inverse PWM_OUTB, after inclusion of the delay discussed below. Switches 301a-301b and 302a-302b operate from the voltage rail Vdd. Generally, the voltage Vdd is sourced from unregulated power-supply 308, having a non-zero output impedance, and consequently the voltage Vdd typically varies with time.

Analog to digital converters (ADCs) 303 and 304 respectively monitor the outputs of switch pairs 301a-301b and 302a-302b and provide corresponding scaled digital representations $V_1$ and $V_2$ to noise shaper 202. Noise shaper 202 utilizes the outputs of ADCs 303 and 304 to correct for variations and noise in the voltage Vdd. Output stage 206 further includes a linear filter 307, which generates the smooth audio output signal $A_{nalog}$ $A_{udio}$ $C_{hannel}$ 1 across the terminals of a full-bridge load, such as speakers 105a, . . . , 105N shown in FIG. 1.

According to the principles of the present invention, a delay is introduced within a selected one of the two signal paths between PWM controller 204 and switch pairs 301a-301b and 302a-302b to insure that switch pairs 301a-301b and 302a-302b do not switch simultaneously or nearly simultaneously. In the illustrated embodiment, a delay stage 305 is shown which delays the inverse PWM encoded stream PWM_OUTB between PWM controller 204 and switch pair 302a-302b, as an example.

Advantageously, exemplary processing path 201a of FIG. 3 only requires a single noise shaper 202 and a single PWM stage 204 for driving both sides of a full-bridge output through switch pairs 301a-301b and 302a-302b. Utilization of a single processing path 201a for each full-bridge output is in contrast to the prior art PWM systems which require two parallel processing paths, each with a noise shaper and a PWM stage, for driving each side of a full-bridge output.

Figure 4:
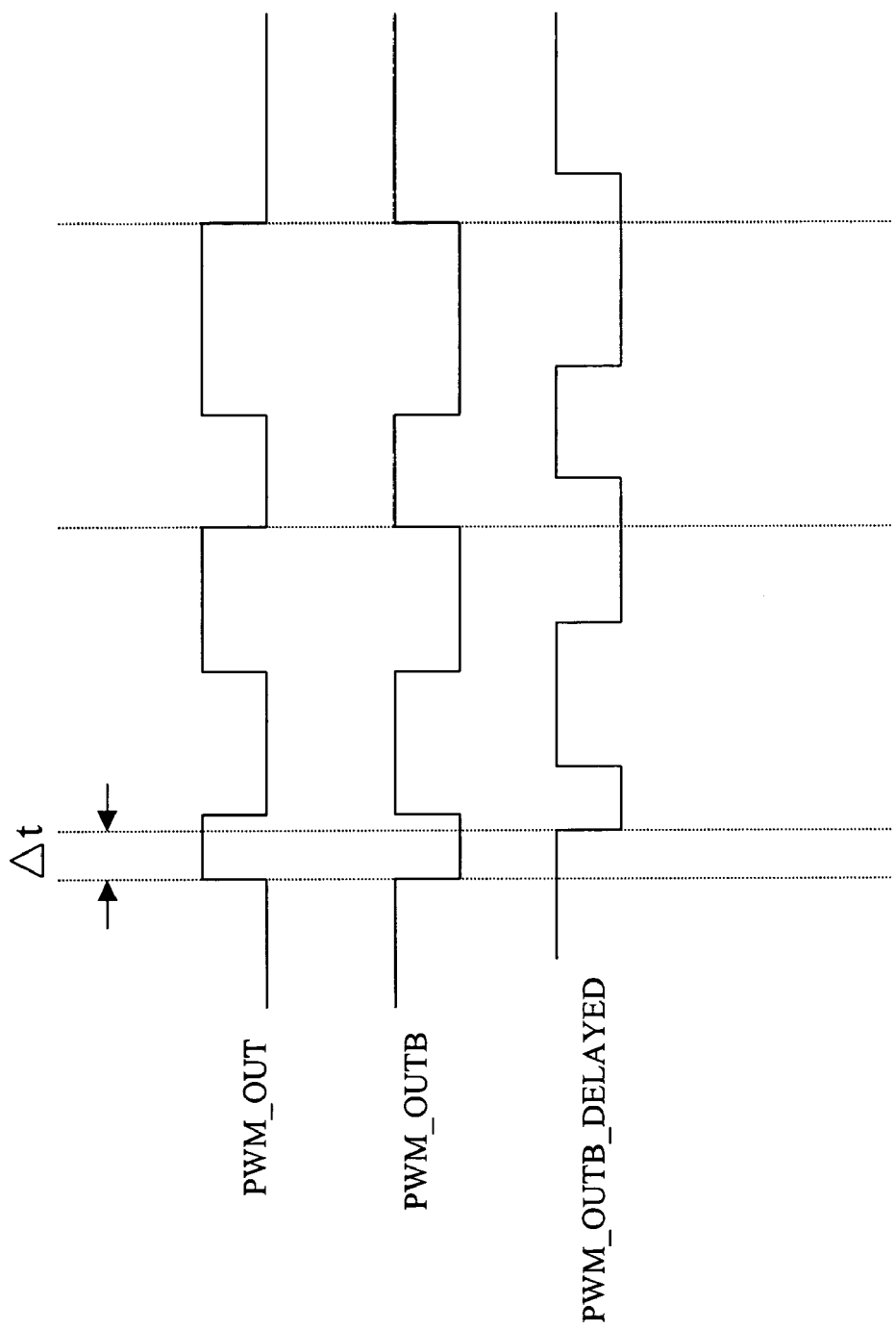
FIG. 4 is an timing diagram illustrating exemplary timing relations between an output signal, an inverted output signal, and a delayed output signal, generated by representative.

Without the introduction of a delay by delay stage 304, nodes A and B at the outputs of transistor pairs 301a-301b and 302a-302b would switch substantially simultaneously, as shown in the upper two traces of FIG. 4. In particular, with each transition (edge) in the output PWM stream, one pair of transistors 301a-301b or 302a-302b would pull the corresponding node A or B up to the high voltage rail Vdd, while the other set of driver transistors 301a-301b or 302a-302b would pull the other node A or B down to ground. Since power supply 308 supplying the voltage Vdd has a non-zero output impedance, this substantially simultaneous switching of output driver transistor pairs 301a-301b and 302a-302b would cause a spike in loading on power supply 308, resulting in glitches at nodes A and B.

Advantageously, delay stage 305 insures that the voltages at nodes A and B do not switch simultaneously or nearly simultaneously. In the illustrated embodiment, delay stage 305 is implemented with a shift register operating in response to the clock signal PWM_CLK, which is also the clock signal utilized to generate the PWM output signals PWM_OUT and PWM_OUTB. The frequency of clock signal PWM_CLK is dependent on the number of PWM levels being generated by PWM stage 204 of FIG. 3. For example, a clock frequency of 27 MHz may be utilized to generate 64 levels, 54 MHz for 128 levels, and 108 MHz for 256 levels.

Hence, since the same clock signal, PWM_CLK, is utilized by both PWM stage 204 and delay stage 305, delay stage 305 offsets the edges of PWM output signal PWM_OUTB, in relation to the edges of PWM output signal PWM_OUT, by a corresponding number of periods of clock signal PWM_CLK.

In the illustrated embodiment, delay stage 305 is register programmable and delays the edges of PWM signal PWM_OUTB by between two (2) to seven (7) edges of the clock signal PWM_CLK. In alternate embodiments, the delay operation may be implemented by delaying the reset of a counter utilized with in PWM stage 204 during the PWM encoding process.

If the delay introduced by delay stage 305 is kept small, no phase compensation is required at nodes A and B. Alternatively, phase compensation may be introduced in delta-sigma modulator 204 of FIGS. 2 and 3.

Figure 5:
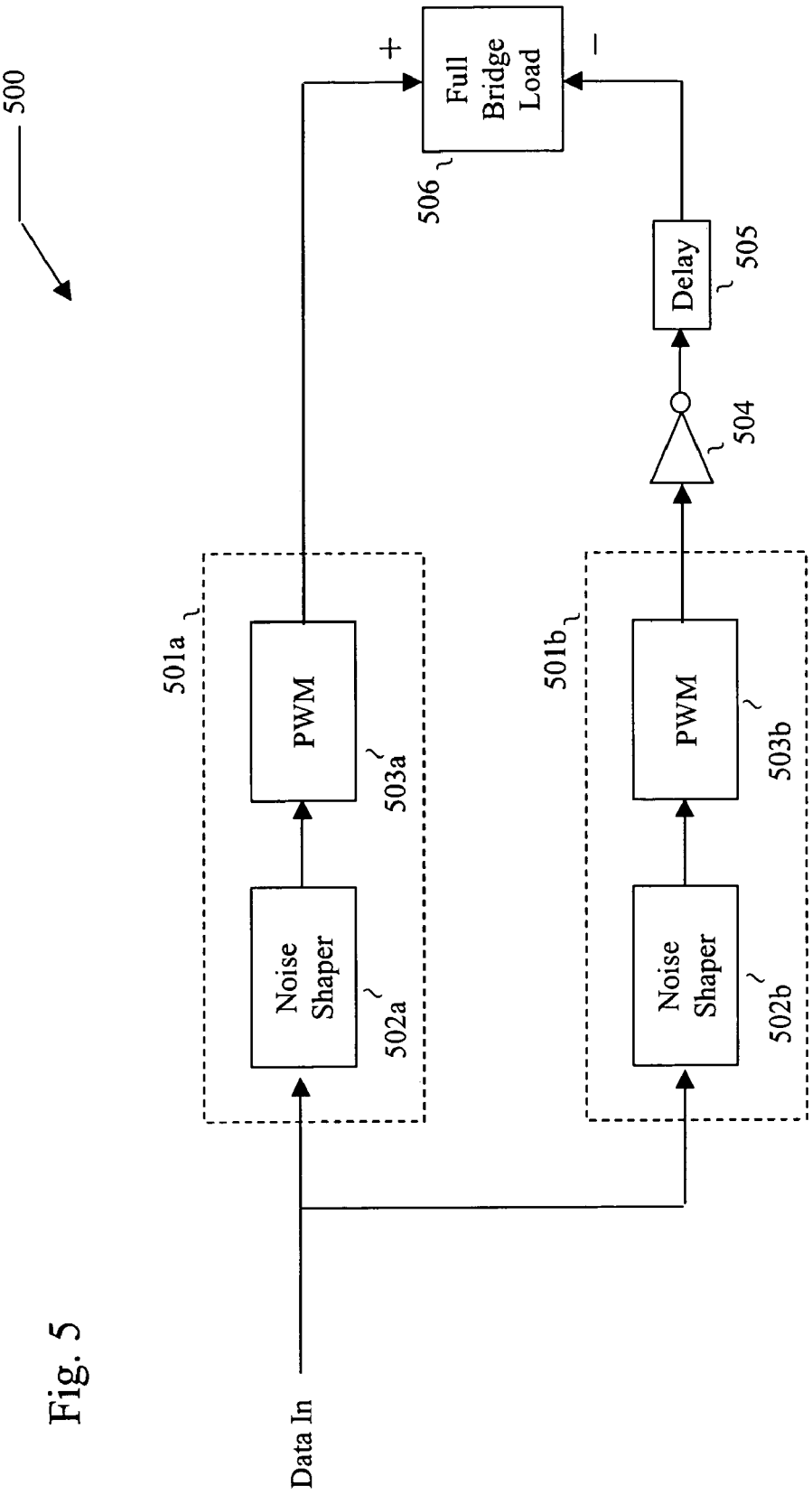
FIG. 5 is a block diagram of an exemplary alternate pulse-width modulation stage according to the principles of the present and suitable for utilization is such applications as the DAC shown in FIG. 1.

FIG. 5 shows a second exemplary pulse-width modulation stage 500 embodying the principles of the present invention. Advantageously, pulse-width modulation stage 500 provides an additional 3 dB of attenuation of the noise floor.

Pulse width modulation stage 500 includes PWM path 501a and 501b operating in parallel on the input signal DATA IN. In the illustrated embodiment of pulse-width modulation stage 500, in which the input signal DATA IN is a digital signal, PWM path 501a includes a noise shaper 502a and a digital PWM encoder 503a, and PWM path 501b includes a noise shaper 502b and a digital PWM encoder 503b. In analog embodiments of pulse width modulation stage 500, PWM paths 501a and 501b are each replaced with an analog PWM encoder and noise shapers are not utilized.

In the digital embodiment of pulse-width modulation stage 500 shown in FIG. 5, the noise generated by noise shapers 502a and 502b may be made uncorrelated, for example by the addition of dither into one or both of noise shapers 502a and 502b. In an analog embodiment, in which analog PWM stages are utilized in PWM paths 501a and 501b, uncorrelated noise in the PWM output signals may be generated by varying the corresponding triangle waveforms controlling the PWM generation operation.

According to the inventive principles, the PWM encoded output signal from second PWM path 501b is inverted by an inverter 504 and then delayed by a delay stage 505. The resulting delayed and inverted PWM signal output from PWM path 501b drives the inverted (−) input to a full-bridge output load 506. PWM path 501a directly drives the non-inverted (+) input to full-bridge output load 506, without inversion or delay.

As discussed in detail above, the introduction of a time difference between the PWM signals driving the non-inverted and inverted terminals of a full-bridge load advantageously ensure that, at least for small levels of the input signal, edges do not coincide temporally.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. A pulse width modulation circuit for driving a full-bridge output load comprising:
    a single pulse width modulation stage for generating from an input data stream a pulse width modulated data stream for driving a terminal of a full-bridge output load and from the input data stream another pulse width modulated data stream for driving another terminal of the full bridge output load, wherein the another pulse width modulated data stream is a complement of the pulse width modulated data stream; and
    delay circuitry for delaying the another pulse width modulated data stream relative to the pulse width modulated data stream such that edges of the another pulse width modulated data stream and edges of the pulse width modulated data stream are temporally spaced.

2. The pulse width modulation circuit of claim 1, further comprising:
    a driver circuit for driving the terminal of the full-bridge output load in response to the pulse width modulated data stream;
    another driver circuit for driving the another terminal of the full-bridge output load in response to the another pulse width modulated data stream; and
    a power supply having a non-zero output impedance supplying a voltage to the driver circuit and the another driver circuit.

3. The pulse width modulation circuit of claim 1, wherein the pulse width modulation circuit is a selected one of a plurality of pulse width modulation circuits forming a portion of a multiple-channel signal processing system.

4. The pulse width modulation circuit of claim 1, wherein the delay circuit comprises a shift register operable to delay the another pulse width modulated data stream by a selected number of periods of a clock signal.

5. The pulse width modulation circuit of claim 4, wherein the selected number of clock periods of the clock signal is programmable.

6. The pulse width modulation circuit of claim 4, wherein the clock signal comprises a clock signal utilized by the pulse width modulation stage for generating the pulse width modulated data stream.

7. The pulse width modulation circuit of claim 1, wherein the delay circuitry is integral to the pulse width modulation stage.

8. A method of driving a full-bridge load comprising:
    generating from an input data stream a pulse width modulated data stream, utilizing a single pulse width modulation stage, for driving a terminal of a full-bridge load and another pulse width modulated data stream for driving another terminal of the full bridge output load, wherein the another pulse width modulated data stream is a complement of the pulse width modulated data stream; and
    delaying the another pulse width modulated data stream relative to the pulse width modulated data stream such that edges of the another pulse width modulated data stream and edges of the pulse width modulated data stream are temporally spaced.

9. The method of claim 8, wherein delaying the another pulse width modulated data stream comprises delaying the another pulse width modulated data by a selected number of periods of a clock signal.

10. The method of claim 8, wherein in generating the pulse width modulated data stream and the another pulse width modulated data stream is performed in response to a clock signal and delaying the another pulse width modulated data stream comprises delaying the another pulse width modulated data stream by a selected number of periods of the clock signal.

11. The method of claim 8, selecting a user selectable amount of delay for delaying the another pulse width modulated data stream.

12. The method of claim 8, wherein the pulse width modulated data stream and the another pulse width pulse data stream are generated from a single power source.

13. An audio circuit comprising:
    a data path including:
        a single pulse width modulation engine for encoding an input signal into an pulse width modulated data stream and an inverse of the pulse width modulated data stream;
        a first driver circuit for driving a first node in response to the pulse width modulated data stream;
        a second driver circuit for driving a second node in response to the inverse of the pulse width modulated data stream; and
        a delay circuit for delaying a selected one of the pulse width modulated data stream and the another pulse width modulated data stream such that edges of the pulse width modulated data stream at the first node are temporally spaced from corresponding edges of the inverse of the pulse width modulated data stream at the second node.

14. The audio circuit of claim 13, further comprising a noise shaper for generating the input signal to the pulse width modulation engine.

15. The audio circuit of claim 13, wherein the data path comprises a selected one of a plurality of like data paths.

16. The audio circuit of claim 13, wherein the delay circuit is programmable to delay the selected one of the pulse width modulated data stream and the inverse of the pulse width modulated data stream by a selected amount.

17. The audio circuit of claim 13, wherein the delay circuit includes a shift register for delaying the selected one of the pulse width modulated data stream and the inverse of the pulse width modulated data stream by a selected number of clock periods of a clock signal.

18. The audio circuit of claim 13, further comprising a full-bridge load coupled across the first and second nodes.

19. The audio circuit of claim 18, wherein the full-ridge load comprises an audio speaker.

20. The audio circuit of claim 13, further comprising a power supply coupled to both the first and second drivers.

21. A pulse-width modulation stage for driving a full-bridge load comprising:
    a first path for generating a first pulse-width modulated data stream from an input data stream for driving a first terminal of a full-bridge load;
    a second path for generating a second pulse width modulated data stream from the input data stream;
    an inverter for inverting the second pulse width modulated data stream; and
    a delay stage for delaying by a selected amount an inverted second pulse width modulated data stream output from the inverter, a delayed inverted second pulse-width modulated data stream output from the delay stage for driving a second terminal of the full-bridge load.

22. The pulse-width modulation stage of claim 21, wherein the first and second paths each comprises a noise shaper and a pulse-width encoder.

23. The pulse-width modulation stage of claim 21, wherein the first and second paths each comprises a pulse-width modulation encoder.

24. The pulse-width modulation stage of claim 23, wherein each pulse-width modulation encoder comprises a digital pulse-width modulation encoder.

25. The pulse-width modulation stage of claim 23, wherein each pulse-width modulation encoder comprises an analog pulse-width modulation encoder.

\* \* \* \* \*